(12) United States Patent
Nagai

(10) Patent No.: US 11,784,383 B2
(45) Date of Patent: Oct. 10, 2023

(54) TRANSMISSION LINE AND ELECTRONIC DEVICE

(71) Applicant: Murata Manufacturing Co., Ltd., Nagaokakyo (JP)

(72) Inventor: Tomohiro Nagai, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 295 days.

(21) Appl. No.: 17/464,805

(22) Filed: Sep. 2, 2021

(65) Prior Publication Data
US 2021/0399398 A1 Dec. 23, 2021

Related U.S. Application Data

(63) Continuation of application No. PCT/JP2020/016487, filed on Apr. 15, 2020.

(30) Foreign Application Priority Data

Apr. 15, 2019 (JP) ................................. 2019-077011

(51) Int. Cl.
*H05K 1/02* (2006.01)
*H01P 3/08* (2006.01)
*H01P 5/02* (2006.01)

(52) U.S. Cl.
CPC .............. *H01P 3/088* (2013.01); *H01P 5/028* (2013.01); *H05K 1/0237* (2013.01)

(58) Field of Classification Search
CPC ......... H05K 1/0237–0245; H01P 3/088; H01P 3/028
See application file for complete search history.

(56) References Cited

U.S. PATENT DOCUMENTS 6,236,572 B1* 5/2001 Teshome .............. H05K 1/0219
174/262
6,429,778 B1* 8/2002 Chuang ............... G01F 23/0023
340/623

(Continued)

FOREIGN PATENT DOCUMENTS

JP   2014-112645 A   6/2014
JP   2014-116574 A   6/2014

(Continued)

OTHER PUBLICATIONS

Official Communication issued in International Patent Application No. PCT/JP2020/016487, dated Jun. 30, 2020.

*Primary Examiner* — Hoa C Nguyen
(74) *Attorney, Agent, or Firm* — KEATING & BENNETT, LLP

(57) ABSTRACT

A transmission line includes first, second, and third signal lines defining a parallel portion. No conductor connecting the first ground conductor and the second ground conductor is between the first signal line and the second signal line, and the first signal line is closer to the ground connection conductor than the second signal line. A closest frequency difference between a fundamental wave of one of the first signal and the second signal and a fundamental wave or a higher harmonic wave of the other of the first signal and the second signal is equal to or larger than a closest frequency difference between a fundamental wave of one of the first signal and the third signal and a fundamental wave or a higher harmonic wave of the other of the first signal and the third signal.

20 Claims, 9 Drawing Sheets

(56) References Cited

U.S. PATENT DOCUMENTS

| | | | | |
|---|---|---|---|---|
| 6,614,325 B1 * | 9/2003 | Kocin | ............... | H05K 1/0245 |
| | | | | 174/251 |
| 9,596,749 B2 * | 3/2017 | Chen | ............... | H05K 3/4644 |
| 10,477,690 B2 * | 11/2019 | Kim | ............... | H05K 1/0221 |
| 2004/0176938 A1 * | 9/2004 | Gisin | ............... | H05K 3/0005 |
| | | | | 703/14 |
| 2006/0232949 A1 * | 10/2006 | Osaka | ............... | H05K 1/0236 |
| | | | | 174/255 |
| 2009/0242244 A1 * | 10/2009 | Hsu | ............... | H05K 1/0245 |
| | | | | 174/255 |
| 2012/0326812 A1 * | 12/2012 | Ohhira | ............... | H01P 3/006 |
| | | | | 333/238 |
| 2014/0133114 A1 | 5/2014 | Saji et al. | | |
| 2014/0133117 A1 | 5/2014 | Saji et al. | | |
| 2014/0184350 A1 * | 7/2014 | Howard | ............... | H01P 3/08 |
| | | | | 427/97.3 |
| 2017/0187087 A1 | 6/2017 | Baba et al. | | |
| 2018/0192509 A1 * | 7/2018 | Song | ............... | H01P 3/08 |
| 2019/0088388 A1 | 3/2019 | Baba et al. | | |
| 2021/0068268 A1 * | 3/2021 | Nagai | ............... | H05K 1/0215 |

FOREIGN PATENT DOCUMENTS

| | | | |
|---|---|---|---|
| WO | 2016/047540 A1 | 3/2016 | |
| WO | 2017/199930 A1 | 11/2017 | |

\* cited by examiner

TRANSMISSION LINE AND ELECTRONIC DEVICE

CROSS REFERENCE TO RELATED APPLICATIONS

This application claims the benefit of priority to Japanese Patent Application No. 2019-077011 filed on Apr. 15, 2019 and is a Continuation Application of PCT Application No. PCT/JP2020/016487 filed on Apr. 15, 2020. The entire contents of each application are hereby incorporated herein by reference.

BACKGROUND OF THE INVENTION

1. Field of the Invention

The present invention relates to a transmission line including a conductor pattern and an insulating substrate holding the conductor pattern, and an electronic device including the transmission line.

2. Description of the Related Art

WO 2017/199930 A discloses a multicore transmission line having a plurality of signal lines in which adjacent signal lines are disposed at different positions in a lamination direction to increase a distance between the signal lines or a ground conductor is disposed between the adjacent signal lines, so as to enhance isolation of the adjacent signal lines.

In the multicore transmission line described in WO 2017/199930 A, in a structure in which isolation between signal lines is secured by disposing adjacent signal lines at different positions in a lamination direction, and making a distance between the signal lines spaced away from each other, the number of laminated insulating substrates increases as the number of signal lines increases, and thus the total thickness increases. In addition, in a structure in which isolation is secured by disposing a ground conductor between adjacent signal lines, the size of the transmission line in the width direction increases as the number of signal lines increases.

When the size of the transmission line increases in the thickness direction or the width direction, it is difficult to incorporate the transmission line into an electronic device having a limited housing size.

SUMMARY OF THE INVENTION

Preferred embodiments of the present invention provide transmission lines each having a reduced size in a thickness direction and a width direction, and electronic devices including such transmission lines. Preferred embodiments of the present invention also provide transmission lines in each of which the number of signal lines is increased without increasing the size in the thickness direction and the width direction, and electronic devices including such transmission lines.

A transmission line according to a preferred embodiment of the present disclosure includes a conductor pattern and a plurality of insulating substrates on which the conductor pattern is provided, and the plurality of insulating substrates are laminated, wherein the conductor pattern includes a plurality of signal lines including a first signal line for a first signal, a second signal line for a second signal, and a third signal line for a third signal, a first ground conductor in a region on a first side of the first signal line, the second signal line, and the third signal line in a lamination direction, and a second ground conductor in a region on a second side opposite to the first side, and a ground connection conductor that connects the first ground conductor and the second ground conductor, the first signal line, the second signal line, and the third signal line are parallel or substantially parallel with each other in a same layer (in the width direction) and define a parallel portion, the ground connection conductor divides the parallel portion into a first region and a second region in a width direction of the plurality of signal lines in the parallel portion, the first signal line and the second signal line are in the first region, the third signal line is in the second region, the parallel portion includes no ground conductor between the first signal line and the second signal line, between the first signal line and the third signal line, and between the second signal line and the third signal line in the lamination direction, the parallel portion includes no conductor connecting the first ground conductor and the second ground conductor between the first signal line and the second signal line, the first signal line is closer to the ground connection conductor than the second signal line in the parallel portion, and a closest frequency difference between a fundamental wave of one of the first signal and the second signal and a fundamental wave or a higher harmonic wave of another of the first signal and the second signal is equal to or larger than a closest frequency difference between a fundamental wave of one of the first signal and the third signal and a fundamental wave or a higher harmonic wave of another of the first signal and the third signal, and is equal to or larger than a closest frequency difference between a fundamental wave of one of the second signal and the third signal and a fundamental wave or a higher harmonic wave of another of the second signal and the third signal.

According to the above configuration, in the parallel portion of the first signal line, the second signal line, and the third signal line, there is no conductor connecting the first ground conductor and the second ground conductor between the first signal line and the second signal line, so that the size in the width direction is able to be reduced. Further, in the parallel portion, the first signal line is closer to the ground connection conductor than the second signal line, that is, the second signal line and the third signal line are relatively far away from each other, so that isolation between the second signal line and the third signal line is ensured. In addition, the ground connection conductor exists between the first signal line and the third signal line, so that isolation between the first signal line and the third signal line is ensured by the ground connection conductor. In addition, a closest frequency difference between a fundamental wave of one of the first signal and the second signal and a fundamental wave or a higher harmonic wave of the other of the first signal and the second signal is larger than a closest frequency difference between a fundamental wave of one of the first signal and the third signal and a fundamental wave or a higher harmonic wave of the other of the first signal and the third signal, and is equal to or larger than a closest frequency difference between a fundamental wave of one of the second signal and the third signal and a fundamental wave or a higher harmonic wave of the other of the second signal and the third signal, so that interference between the first signal and the second signal is effectively reduced or prevented.

An electronic device according to a preferred embodiment of the present disclosure includes a transmission line according to a preferred embodiment of the present invention, a circuit board on which the transmission line is mounted, and a housing that houses the transmission line and the circuit board. With this configuration, a small electric device is provided while including many signal lines.

According to preferred embodiments of the present invention, it is possible to obtain transmission lines each of whose size in the thickness direction and the width direction is reduced and electronic devices including such transmission lines. In addition, it is possible to obtain transmission lines in each of which the number of signal lines is increased without increasing the size in the thickness direction and the width direction, and electronic devices including such transmission lines.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
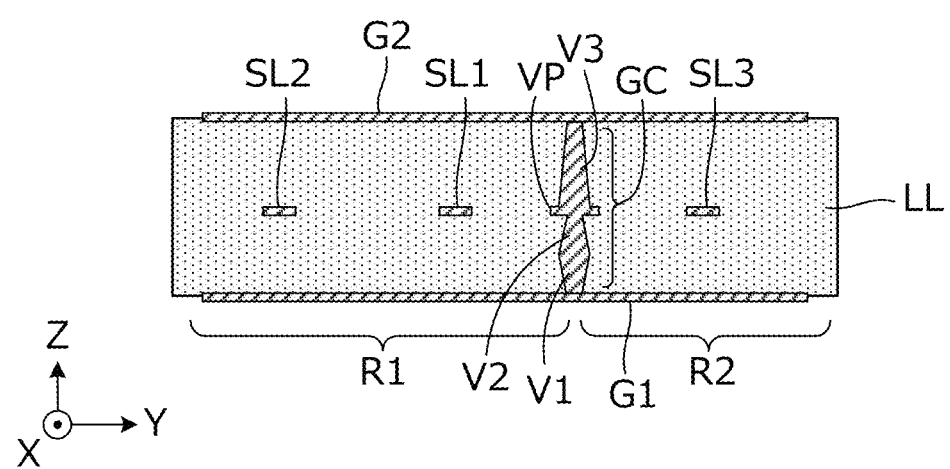
FIG. 1 is a cross-sectional view of a transmission line 101 according to a first preferred embodiment of the present invention.

Hereinafter, preferred embodiments of the present invention will be described with reference to specific examples and the drawings. In the drawings, the same or corresponding portions are denoted by the same reference numerals. In consideration of the description of the main points or ease of understanding, the preferred embodiments are divided into a plurality of preferred embodiments for convenience of description, but partial replacement or combination of configurations shown in different preferred embodiments is possible. In the second and subsequent preferred embodiments, descriptions of matters common to the first preferred embodiment will be omitted, and only different points will be described. Specifically, the same advantageous operations and effects by the same or substantially the same configuration will not be sequentially described for each preferred embodiment.

First Preferred Embodiment

In a first preferred embodiment of the present invention, a transmission line including three signal lines will be exemplified.

Figure 2:
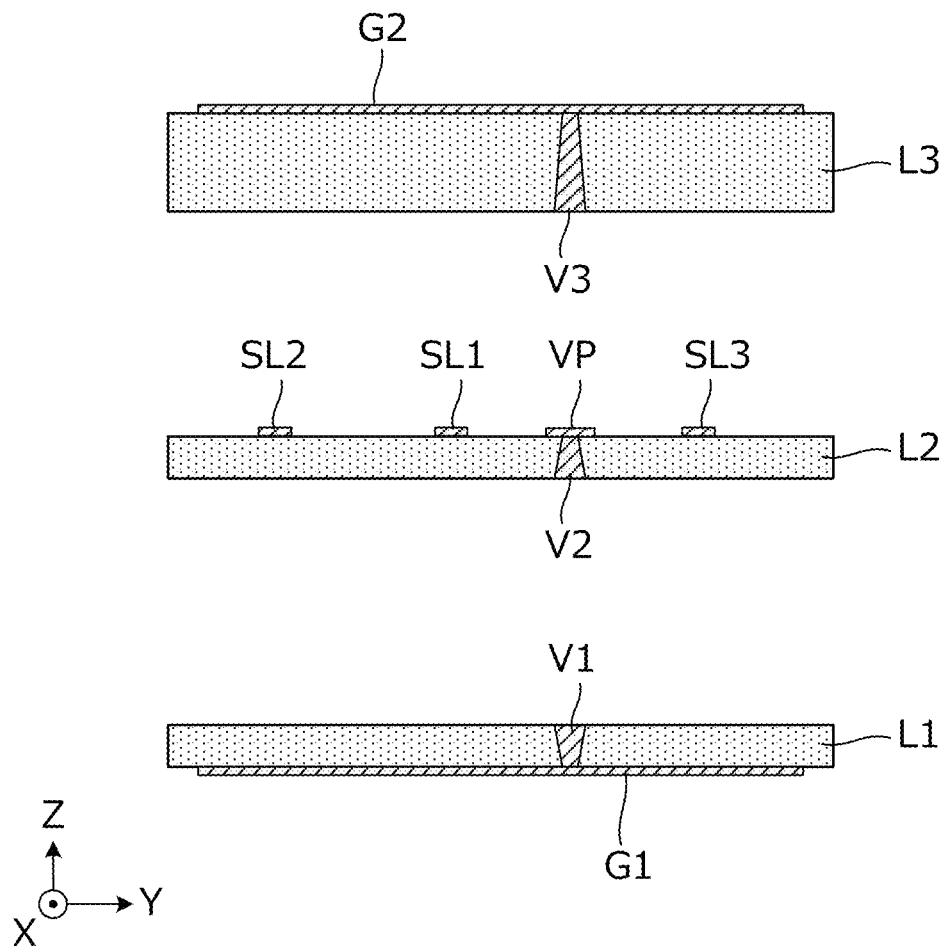
FIG. 2 is a cross-sectional view of the transmission line 101 in a state of an insulating substrate before lamination.
Figure 3:
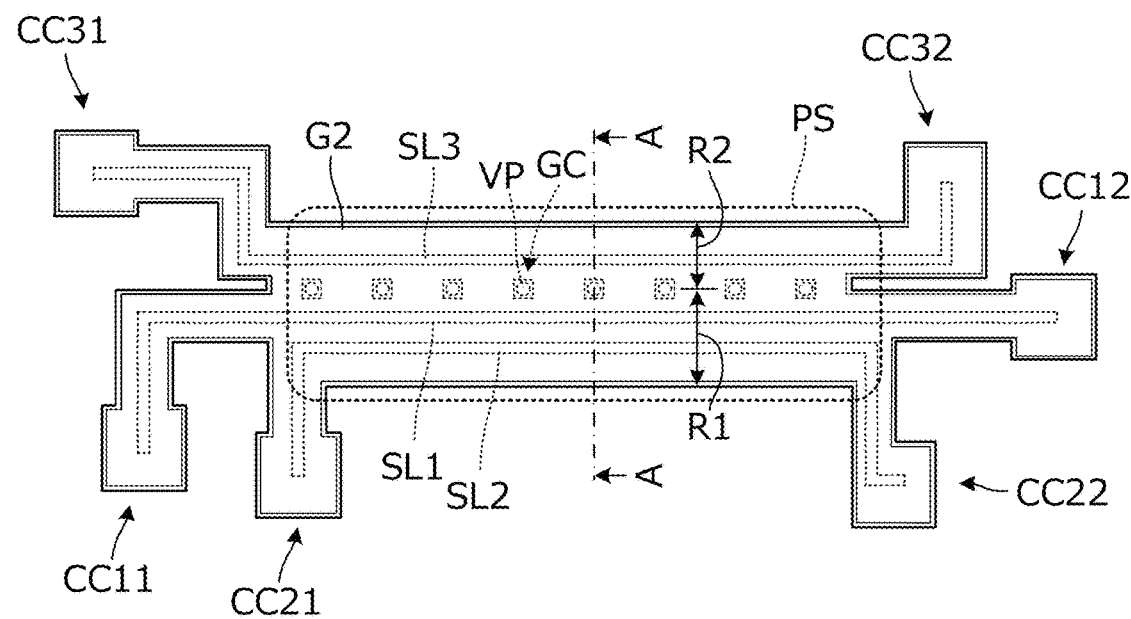
FIG. 3 is a plan view of the transmission line 101.
Figure 3:
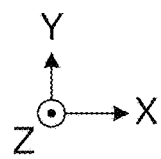

FIG. 1 is a cross-sectional view of a transmission line 101 according to the first preferred embodiment. FIG. 2 is a cross-sectional view of the transmission line 101 in a state of an insulating substrate before lamination. FIG. 3 is a plan view of the transmission line 101. FIGS. 1 and 2 are cross-sectional views of a portion taken along line A-A in FIG. 3.

As illustrated in FIG. 2, the transmission line 101 of the present preferred embodiment includes a conductor pattern and insulating substrates L1, L2, and L3 on which the conductor pattern is provided, and the insulating substrates are laminated. A first ground conductor G1 and a via conductor V1 are provided in the insulating substrate L1. On an insulating substrate L2, a first signal line SL1 for a first signal, a second signal line SL2 for a second signal, a third signal line SL3 for a third signal, a via conductor V2, and a via connection conductor VP are provided. A second ground conductor G2 and a via conductor V3 are provided on an insulating substrate L3.

As illustrated in FIG. 1, the insulating substrates L1, L2, and L3 are laminated to define a laminated body LL of insulating substrates. The first ground conductor G1 and the second ground conductor G2 face each other in the lamination direction of the insulating substrates L1, L2, and L3. The first signal line SL1, the second signal line SL2, and the third signal line SL3 are disposed between the first ground conductor G1 and the second ground conductor G2. The first ground conductor G1 and the second ground conductor G2 overlap the first signal line SL1, the second signal line SL2, and the third signal line SL3 when viewed in the lamination direction (Z-axis direction).

The via conductors V1, V2, and V3 and the via connection conductor VP constitute a ground connection conductor GC. The first ground conductor G1 and the second ground conductor G2 are connected with the ground connection conductor GC interposed therebetween.

The insulating substrates L1, L2, and L3 are thermoplastic resin sheets such as polyimide and liquid crystal polymer, for example, and the insulating substrates L1, L2, and L3 are collectively laminated and heated and pressed to form the laminated body LL. The signal lines SL1, SL2, and SL3 and the ground conductors G1 and G2 are obtained by patterning a metal foil such as, for example, copper by photolithography and etching. The via conductors V1, V2, and V3 are formed by filling a via conductor hole in the insulating substrates L1, L2, and L3 with a metal material including, for example, tin or the like as a main component.

As illustrated in FIGS. 2 and 3, the first signal line SL1, the second signal line SL2, and the third signal line SL3 define a parallel portion PS in which the lines are parallel or substantially parallel with each other in the same layer. The ground connection conductor GC divides the parallel portion into a first region R1 and a second region R2 in the width direction (Y-axis direction) of the signal lines SL1, SL2, and SL3 in the parallel portion.

The first signal line SL1 and the second signal line SL2 are disposed in the first region R1, and the third signal line SL3 is disposed in the second region R2. In the parallel portion PS, there is no conductor connecting the first ground conductor G1 and the second ground conductor G2 between the first signal line SL1 and the second signal line SL2. In the parallel portion PS, the first signal line SL1 is closer to the ground connection conductor GC than the second signal line SL2.

The first ground conductor G1, the second ground conductor G2, and the first signal line SL1 define a first stripline, the first ground conductor G1, the second ground conductor G2, and the second signal line SL2 define a second stripline, and the first ground conductor G1, the second ground conductor G2, and the third signal line SL3 define a third stripline.

As illustrated in FIG. 3, a connection portion CC11 is provided at one end of the first stripline including the first signal line SL1, and a connection portion CC12 is provided at the other end. A connection portion CC21 is provided at one end of the second stripline including the second signal line SL2, and a connection portion CC22 is provided at the other end. In addition, a connection portion CC31 is provided at one end of the third stripline including the third signal line SL3, and a connection portion CC32 is provided at the other end.

A coaxial connectors is provided on the lower surface of each of the connection portions CC11, CC12, CC21, CC22, CC31, and CC32.

Each of the first signal and the second signal is a signal of a predetermined frequency band, and may include not only a fundamental wave but also a higher harmonic wave. Therefore, there is a frequency difference between a fundamental wave of one of the first signal and the second signal and a fundamental wave or a higher harmonic wave of the other. The smallest difference in frequency among these frequency differences is hereinafter referred to as a "closest frequency difference".

Note that the fundamental wave means the frequency of the lowest frequency component among the plurality of frequency components of the signal. The higher harmonic wave is a frequency component other than the fundamental wave. The fundamental wave and the higher harmonic wave can be measured using a frequency analyzer, such as Fast Fourier transform (FFT), for example.

In addition, the "closest frequency" is, for example, specifically, described in the following example. One fundamental wave is a fundamental wave of f2 (for example, about 850 MHz), and the other fundamental wave is a fundamental wave of f1 (for example, about 2100 MHz). The difference between the fundamental wave of f2 (about 850 MHz) and the fundamental wave of f1 (2100 MHz) is about 1250 MHz. The difference between the second higher harmonic wave of f2 (for example, about 1700 MHz) and the fundamental wave of f1 (for example, about 2100 MHz) is about 400 MHz. The difference between the third higher harmonic wave of f2 (for example, about 2550 MHz) and the fundamental wave of f1 (for example, about 2100 MHz) is about 450 MHz. The difference between the fundamental wave of f2 (for example, about 850 MHz) and the second higher harmonic wave of f1 (for example, about 4200 MHz) is about 3350 MHz.

Therefore, in this example, the "closest frequency" is 400 MHz. Note that other frequency relationships, for example, relationships between f1, f2, f3, f4, and f5 to be described later, are also defined by the same definition.

In the transmission line 101 of the present preferred embodiment, a closest frequency difference between a fundamental wave of one of the first signal propagating through the first stripline and the second signal propagating through the second stripline and a fundamental wave or a higher harmonic wave of the other of the first signal and the second signal is equal to or larger than a closest frequency difference between a fundamental wave of one of the first signal and the third signal and a fundamental wave or a higher harmonic wave of the other of the first signal and the third signal. In other words, a closest frequency difference between a fundamental wave of one of the first signal and the third signal propagating through the first signal line SL1 and the third signal line SL3 adjacent to each other with the ground connection conductor GC interposed therebetween and a fundamental wave or a higher harmonic wave of the other of the first signal and the third signal is relatively small, whereas a closest frequency difference between a fundamental wave of one of the first signal and the second signal propagating through the first signal line SL1 and the second signal line SL2 adjacent to each other without the ground connection conductor GC interposed therebetween and a fundamental wave or a higher harmonic wave of the other of the first signal and the second signal is relatively large.

In addition, a closest frequency difference between a fundamental wave of one of the first signal and the second signal and a fundamental wave or a higher harmonic wave of the other of the first signal and the second signal is equal to or larger than a closest frequency difference between a fundamental wave of one of the second signal and the third signal and a fundamental wave or a higher harmonic wave of the other of the second signal and the third signal. In other words, a closest frequency difference between a fundamental wave of one of the second signal and the third signal propagating through the second signal line SL2 and the third signal line SL3 with the ground connection conductor GC interposed therebetween and a fundamental wave or a higher harmonic wave of the other of the second signal and the third signal is relatively small, whereas a closest frequency difference between a fundamental wave of one of the first signal and the second signal propagating through the first signal line SL1 and the second signal line SL2 adjacent without the ground connection conductor GC interposed therebetween and a fundamental wave or a higher harmonic wave of the other of the first signal and the second signal is relatively large.

For example, when the fundamental wave frequency of the first signal is represented by f1, the fundamental wave frequency of the second signal is represented by f2, and the fundamental wave frequency of the third signal is represented by f3, f1 may be about 2100 MHz, f2 may be about 850 MHz, and f3 may be about 900 MHz. In this case, the closest frequency difference between f1 and f2 is a frequency difference of about 400 MHz (2100-850×2=400) between the fundamental wave of f1 and the second higher harmonic wave of f2. In addition, the closest frequency difference between f1 and f3 is a frequency difference of about 300 MHz (2100-1800=300) between the fundamental wave of f1 and the second higher harmonic wave of f3. Further, the closest frequency difference between f2 and f3 is a frequency difference of about 50 MHz (900-850=50) between the fundamental wave of f2 and the fundamental wave of f3. Therefore, the above conditions are satisfied.

That is, $|f1-2f2|>|f1-2f3|$ is satisfied, and $|f1-2f2|>|f2-f3|$ is satisfied.

In addition, in the transmission line 101 of the present preferred embodiment, a closest frequency difference between a fundamental wave of one of the third signal and the first signal and a fundamental wave or a higher harmonic wave of the other of the third signal and the first signal is equal to or larger than a closest frequency difference between a fundamental wave of one of the third signal and the second signal and a fundamental wave or a higher harmonic wave of the other of the third signal and the second signal. In other words, a closest frequency difference between a fundamental wave of one of the third signal and the second signal propagating through the third signal line SL3 and the second signal line SL2 that are not close to each other and a fundamental wave or a higher harmonic wave of the other of the third signal and the second signal is relatively small, and a closest frequency difference between a fundamental wave of one of the third signal and the first signal propagating through the third signal line SL3 and the first signal line SL1 that are close and adjacent to each other and a fundamental wave or a higher harmonic wave of the other of the third signal and the first signal is relatively large.

In the present preferred embodiment, the closest frequency difference between f3 and f1 is about 300 MHz as described above, and the frequency difference between the fundamental wave of f3 and the fundamental wave of f2 is about 50 MHz as described above, and this condition is also satisfied.

That is, |f1−2f3|>|f2−f3| is satisfied.

In the above example, the same holds true even when the fundamental wave frequency f1 of the first signal and the fundamental wave frequency f2 of the second signal are interchanged.

That is, even when f1 is about 850 MHz, f2 is about 2100 MHz, and f3 is about 900 MHz, |2f1−f2|>|f1−f3| is satisfied.

In addition, |2f1−f2|>|f2−2f3| is satisfied.

In the examples illustrated in FIGS. 1 and 2, the first signal line SL1, the second signal line SL2, and the third signal line SL3 are all parallel or substantially parallel in the same layer, but the first signal line SL1, the second signal line SL2, and the third signal line SL3 may be provided in different layers and extend parallel or substantially parallel. For example, the formation layer of the first signal line SL1 and the second signal line SL2 and the formation layer of the third signal line SL3 may be different from each other. Further, as another example, the first signal line SL1 and the second signal line SL2 may also be provided in different layers. However, the ground conductor is not provided between the signal lines in the different layers. That is, the structure in which there is no ground conductor between the signal lines as described above results in a problem with the isolation between the adjacent signal lines, but according to the structure of the present preferred embodiment, the isolation between the signal lines is ensured.

According to the present preferred embodiment, the following advantageous effects are obtained.

Since the first signal line SL1, the second signal line SL2, and the third signal line SL3 are not spaced apart in the lamination direction but are provided in the same layer, the size in the thickness direction (Z-axis direction) of the transmission line can be reduced.

In the parallel portion PS of the first signal line SL1, the second signal line SL2, and the third signal line SL3, there is no conductor connecting the first ground conductor G1 and the second ground conductor G2 between the first signal line SL1 and the second signal line SL2, so that the size in the width direction (Y-axis direction) of the transmission line can be reduced.

In the parallel portion PS, the first signal line SL1 is closer to the ground connection conductor GC than the second signal line SL2, that is, the second signal line SL2 and the third signal line SL3 are relatively far away from each other, so that isolation between the second signal line SL2 and the third signal line SL3 is secured.

The ground connection conductor GC exists between the first signal line SL1 and the third signal line SL3, so that isolation between the first signal line SL1 and the third signal line SL3 is ensured by the ground connection conductor GC.

A closest frequency difference between a fundamental wave of one of the first signal and the second signal and a fundamental wave or a higher harmonic wave of the other of the first signal and the second signal is larger than a closest frequency difference between a fundamental wave of one of the first signal and the third signal and a fundamental wave or a higher harmonic wave of the other of the first signal and the third signal, so that interference between the first signal and the second signal is effectively reduced or prevented.

A closest frequency difference between a fundamental wave of one of the first signal and the second signal and a fundamental wave or a higher harmonic wave of the other of the first signal and the second signal is equal to or larger than a closest frequency difference between a fundamental wave of one of the second signal and the third signal and a fundamental wave or a higher harmonic wave of the other of the second signal and the third signal, so that interference between the first signal and the second signal is effectively reduced or prevented.

A closest frequency difference between a fundamental wave of one of the third signal and the first signal and a fundamental wave or a higher harmonic wave of the other of the third signal and the first signal is equal to or larger than a closest frequency difference between a fundamental wave of one of the third signal and the second signal and a fundamental wave or a higher harmonic wave of the other of the third signal and the second signal, so that isolation between the third signal and the first signal is ensured while the isolation between the third signal and the second signal is maintained.

Although FIG. 3 illustrates an example in which the plurality of via connection conductors VP independent from each other are provided, the via connection conductor VP may be a single linear conductor pattern extending along the first signal line SL1 and the third signal line SL3. With this configuration, the isolation between the first signal line SL1 and the third signal line SL3 can be further improved.

Second Preferred Embodiment

In a second preferred embodiment of the present invention, a transmission line including four signal lines will be exemplified.

Figure 4:
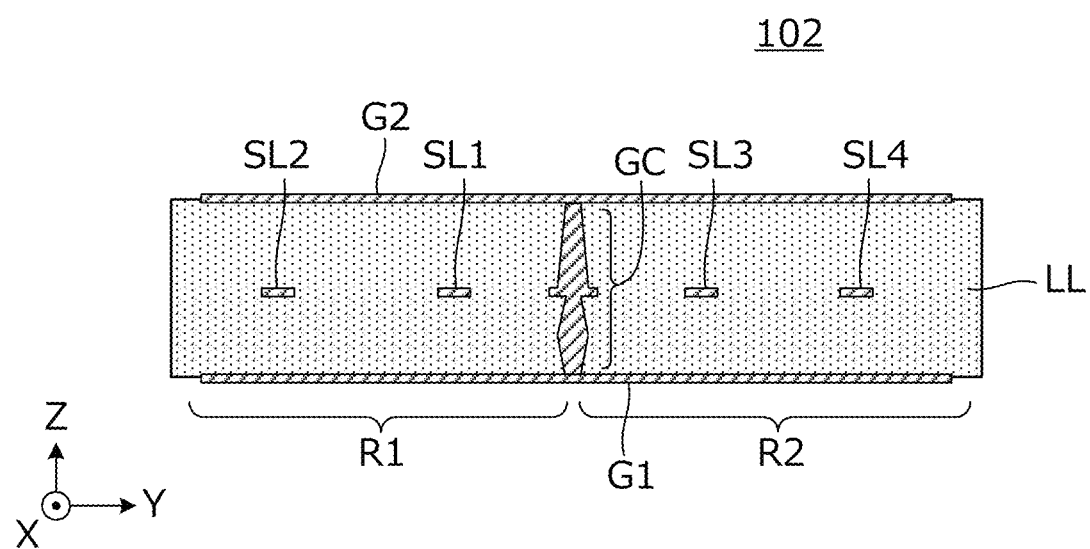
FIG. 4 is a cross-sectional view of a transmission line 102 according to a second preferred embodiment of the present invention.

FIG. 4 is a cross-sectional view of a transmission line 102 according to the second preferred embodiment. The transmission line 102 further includes a fourth signal line SL4 adjacent to the third signal line SL3 in the transmission line 101 described in the first preferred embodiment. The configuration of each insulating substrate, the configuration of the parallel portion, and the like are the same as or similar to those of the transmission line 101 described in the first preferred embodiment.

As illustrated in FIG. 4, a plurality of insulating substrates are laminated to define the laminated body LL of insulating substrates. The first ground conductor G1 and the second ground conductor G2 face each other in the lamination direction of the laminated body LL of the insulating substrate. The first signal line SL1 for a first signal, the second signal line SL2 for a second signal, the third signal line SL3 for a third signal, and the fourth signal line SL4 for a fourth signal are disposed between the first ground conductor G1 and the second ground conductor G2. The first ground conductor G1 and the second ground conductor G2 overlap the first signal line SL1, the second signal line SL2, the third signal line SL3, and the fourth signal line SL4 when viewed in the lamination direction (Z-axis direction). The first ground conductor G1 and the second ground conductor G2 are connected with the ground connection conductor GC interposed therebetween.

The first signal line SL1, the second signal line SL2, the third signal line SL3, and the fourth signal line SL4 define a parallel portion and are parallel or substantially parallel with each other in the same layer (in the width direction). The ground connection conductor GC divides the parallel portion into the first region R1 and the second region R2 in the width direction (Y-axis direction) of the signal lines SL1, SL2, SL3, and SL4 in the parallel portion.

In the parallel portion, there is no conductor connecting the first ground conductor G1 and the second ground conductor G2 between the third signal line SL3 and the fourth signal line SL4.

The first ground conductor G1, the second ground conductor G2, and the first signal line SL1 define a first stripline, the first ground conductor G1, the second ground conductor G2, and the second signal line SL2 define a second stripline, the first ground conductor G1, the second ground conductor G2, and the third signal line SL3 define a third stripline, and the first ground conductor G1, the second ground conductor G2, and the fourth signal line SL4 define a fourth stripline.

In the transmission line 102 of the present preferred embodiment, a closest frequency difference between a fundamental wave of one of the third signal and the fourth signal and a fundamental wave or a higher harmonic wave of the other of the third signal and the fourth signal is equal to or larger than a closest frequency difference between a fundamental wave of one of the third signal and the first signal and a fundamental wave or a higher harmonic wave of the other of the third signal and the first signal. In other words, a closest frequency difference between a fundamental wave of one of the third signal and the first signal propagating through the third signal line SL3 and the first signal line SL1 adjacent to each other with the ground connection conductor GC interposed therebetween and a fundamental wave or a higher harmonic wave of the other of the third signal and the first signal is relatively small, whereas a closest frequency difference between a fundamental wave of one of the third signal and the fourth signal propagating through the second signal line SL2 and the fourth signal line SL4 adjacent to each other without the ground connection conductor GC interposed therebetween and a fundamental wave or a higher harmonic wave of the other of the third signal and the fourth signal is relatively large.

For example, when the fundamental wave frequency of the first signal is represented by f1, the fundamental wave frequency of the second signal is represented by f2, the fundamental wave frequency of the third signal is represented by f3, and the fundamental wave frequency of the fourth signal is represented by f4, for example, f1 may be about 2100 MHz, f2 may be about 850 MHz, f3 may be about 900 MHz, and f4 may be about 2100 MHz. In this case, the closest frequency difference between f3 and f4 is a frequency difference of about 300 MHz (2100-900×2=300) between the second higher harmonic wave of f3 and the fundamental wave of f4. In addition, the closest frequency difference between f3 and f1 is a frequency difference of about 300 MHz (2100-900×2=300) between the second higher harmonic wave of f3 and the fundamental wave of f1. Therefore, the above conditions are satisfied.

In addition, in the transmission line 102 of the present preferred embodiment, a closest frequency difference between a fundamental wave of one of the first signal and the third signal and a fundamental wave or a higher harmonic wave of the other of the first signal and the third signal is equal to or larger than a closest frequency difference between a fundamental wave of one of the first signal and the fourth signal and a fundamental wave or a higher harmonic wave of the other of the first signal and the fourth signal. In other words, a closest frequency difference between a fundamental wave of one of the first signal and the third signal propagating through the first signal line SL1 and the third signal line SL3 with the ground connection conductor GC interposed therebetween and a fundamental wave or a higher harmonic wave of the other of the first signal and the third signal is relatively small, whereas a closest frequency difference between a fundamental wave of one of the first signal and the fourth signal propagating through the first signal line SL1 and the fourth signal line SL4 adjacent without the ground connection conductor GC interposed therebetween and a fundamental wave or a higher harmonic wave of the other of the first signal and the fourth signal is relatively large.

In the present preferred embodiment, for example, the closest frequency difference between f1 and f3 is about 300 MHz as described above, and the frequency difference between the fundamental wave of f1 and the fundamental wave of f4 is about 0 MHz as described above, and this condition is also satisfied.

According to the present preferred embodiment, the following advantageous effects are obtained in addition to the advantageous effects described in the first preferred embodiment.

The frequency difference between the signals propagating through the signal lines adjacent to each other (a closest frequency difference between a fundamental wave of one of the signals and a fundamental wave or a higher harmonic wave of the other) is larger than the frequency difference between the signals of the signal lines not adjacent to each other (a closest frequency difference between a fundamental wave of one of the signals and a fundamental wave or a higher harmonic wave of the other), so that isolation between the signal lines adjacent to each other can be effectively ensured.

In the example illustrated in FIG. 4, the isolation between the signal lines SL2 and SL1, the isolation between the signal lines SL1 and SL3, and the isolation between the signal lines SL3 and SL4 are ensured. The isolation between the signal lines SL1 to SL3 is further ensured by the ground connection conductor GC.

Third Preferred Embodiment

Also in a third preferred embodiment of the present invention, a transmission line including four signal lines will be exemplified.

Figure 5:
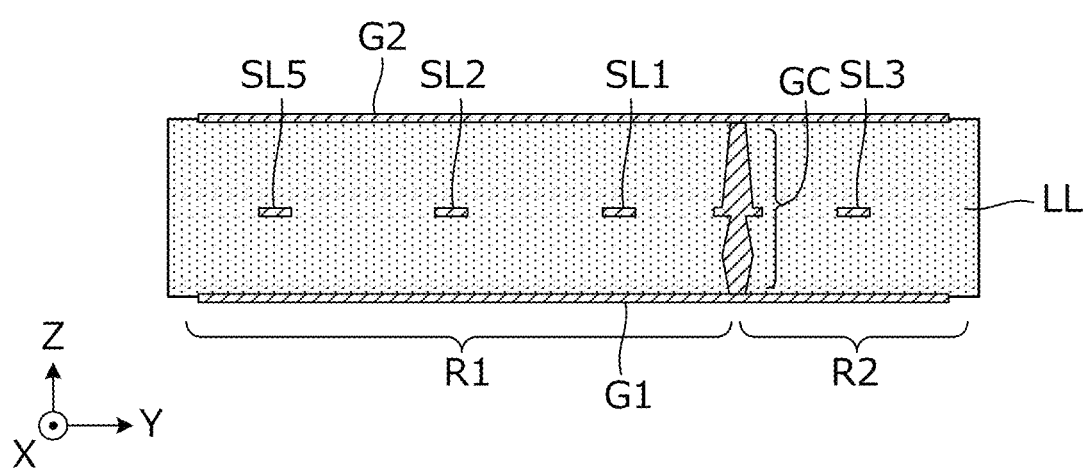
FIG. 5 is a cross-sectional view of a transmission line 103 according to a third preferred embodiment of the present invention.

FIG. 5 is a cross-sectional view of a transmission line 103 according to the third preferred embodiment. The transmission line 103 further includes a fifth signal line SL5 adjacent to the second signal line SL2 in the transmission line 101 described in the first preferred embodiment. The configuration of each insulating substrate, the configuration of the parallel portion, and the like are the same as or similar to those of the transmission line 101 described in the first preferred embodiment.

As illustrated in FIG. 5, a plurality of insulating substrates are laminated to define the laminated body LL of insulating substrates. The first ground conductor G1 and the second ground conductor G2 face each other in the lamination direction of the laminated body LL of the insulating substrate. The first signal line SL1 for a first signal, the second signal line SL2 for a second signal, the third signal line SL3 for a third signal, and the fifth signal line SL5 for a fifth signal are disposed between the first ground conductor G1 and the second ground conductor G2. The first ground conductor G1 and the second ground conductor G2 overlap the first signal line SL1, the second signal line SL2, the third signal line SL3, and the fifth signal line SL5 when viewed in the lamination direction (Z-axis direction). The first ground conductor G1 and the second ground conductor G2 are connected with the ground connection conductor GC interposed therebetween.

The first signal line SL1, the second signal line SL2, the third signal line SL3, and the fifth signal line SL5 define a parallel portion and are parallel or substantially parallel with each other in the same layer (in the width direction). The fifth signal line SL5 is disposed at a position opposite to the first signal line SL1 with respect to the second signal line SL2. The ground connection conductor GC divides the parallel portion into the first region R1 and the second region R2 in the width direction (Y-axis direction) of the signal lines SL1, SL2, SL3, and SL5 in the parallel portion.

In the parallel portion, there is no conductor connecting the first ground conductor G1 and the second ground conductor G2 between the second signal line SL2 and the fifth signal line SL5.

The first ground conductor G1, the second ground conductor G2, and the first signal line SL1 define a first stripline, the first ground conductor G1, the second ground conductor G2, and the second signal line SL2 define a second stripline, the first ground conductor G1, the second ground conductor G2, and the third signal line SL3 define a third stripline, and the first ground conductor G1, the second ground conductor G2, and the fifth signal line SL5 define a fifth stripline.

In the transmission line 103 of the present preferred embodiment, a closest frequency difference between a fundamental wave of one of the fifth signal and the second signal and a fundamental wave or a higher harmonic wave of the other of the fifth signal and the second signal is equal to or larger than a closest frequency difference between a fundamental wave of one of the fifth signal and the first signal and a fundamental wave or a higher harmonic wave of the other of the fifth signal and the first signal.

For example, when the fundamental wave frequency of the first signal is represented by f1, the fundamental wave frequency of the second signal is represented by f2, the fundamental wave frequency of the third signal is represented by f3, and the fundamental wave frequency of the fifth signal is represented by f5, f1 may be about 2100 MHz, f2 may be about 850 MHz, f3 may be about 2100 MHz, and f5 may be about 2100 MHz. In this case, the closest frequency difference between f5 and f2 is a frequency difference of about 400 MHz (2100-850×2=400) between the fundamental wave of f5 and the second higher harmonic wave of f2. In addition, the closest frequency difference between f5 and f1 is a frequency difference of about 0 MHz (2100-2100=0) between the fundamental wave of f5 and the fundamental wave of f1. Therefore, the above conditions are satisfied. That is, |f5−2f2|>|f5−f1| is satisfied.

Further, in the transmission line 103 of the present preferred embodiment, a closest frequency difference between a fundamental wave of one of the second signal and the first signal and a fundamental wave or a higher harmonic wave of the other of the second signal and the first signal and a closest frequency difference between a fundamental wave of one of the second signal and the fifth signal and a fundamental wave or a higher harmonic wave of the other of the second signal and the fifth signal are larger than a closest frequency difference between a fundamental wave of one of the first signal and the fifth signal and a fundamental wave or a higher harmonic wave of the other of the first signal and the fifth signal. In the present preferred embodiment, the closest frequency difference between f2 and f1 is about 400 MHz as described above, the closest frequency difference between f2 and f5 is about 400 MHz as described above, the frequency difference between the fundamental wave of f1 and the fundamental wave of f5 is about 0 MHz as described above, and this condition is also satisfied. That is, |2f2−f1|>|f1−f5| and |2f2−f5|>|f1−f5| are satisfied.

In the above example, the example in which the three signals have the same frequency and two types of frequency signals are handled is described. However, the present invention can be similarly applied to a case where three types of frequency signals are handled as follows.

For example, when f1 is about 2100 MHz, f2 is about 850 MHz, f3 is about 900 MHz, and f5 is about 2100 MHz, the closest frequency difference between f5 and f2 is a frequency difference of about 400 MHz (2100-850×2=400) between the fundamental wave of f5 and the second higher harmonic wave of f2. In addition, the closest frequency difference between f5 and f1 is a frequency difference of about 0 MHz (2100-2100=0) between the fundamental wave of f5 and the fundamental wave of f1. Therefore, the above conditions are satisfied. That is, |f5−2f2|>|f5−f1| is satisfied.

In addition, the closest frequency difference between f2 and f1 is about 400 MHz as described above, the closest frequency difference between f2 and f5 is about 400 MHz as described above, and the frequency difference between the fundamental wave of f1 and the fundamental wave of f5 is about 0 MHz as described above, and this condition is also satisfied. That is, |2f2−f1|>|f1−f5| and |2f2−f5|>|f1−f5| are satisfied.

According to the present preferred embodiment, the following advantageous effects are obtained in addition to the advantageous effects described in the first preferred embodiment.

In the parallel portion of the third signal line SL3, the first signal line SL1, the second signal line SL2, and the fifth signal line SL5, there is no conductor connecting the first ground conductor G1 and the second ground conductor G2 between the second signal line SL2 and the fifth signal line SL5, so that the size in the width direction (Y-axis direction) can be reduced.

A closest frequency difference between a fundamental wave of one of the fifth signal and the second signal and a fundamental wave or a higher harmonic wave of the other of the fifth signal and the second signal is equal to or larger than a closest frequency difference between a fundamental wave of one of the fifth signal and the first signal and a fundamental wave or a higher harmonic wave of the other of the fifth signal and the first signal, so that interference between the second signal and the fifth signal is effectively reduced or prevented.

A closest frequency difference between a fundamental wave of one of the second signal and the first signal and a fundamental wave or a higher harmonic wave of the other of the second signal and the first signal and a closest frequency difference between a fundamental wave of one of the second signal and the fifth signal and a fundamental wave or a higher harmonic wave of the other of the second signal and the fifth signal are larger than a closest frequency difference between a fundamental wave of one of the first signal and the fifth signal and a fundamental wave or a higher harmonic wave of the other of the first signal and the fifth signal, so that interference between the first signal and the fifth signal is effectively reduced or prevented.

Fourth Preferred Embodiment

Also in a fourth preferred embodiment of the present invention, a transmission line including four signal lines will be exemplified.

Figure 6:
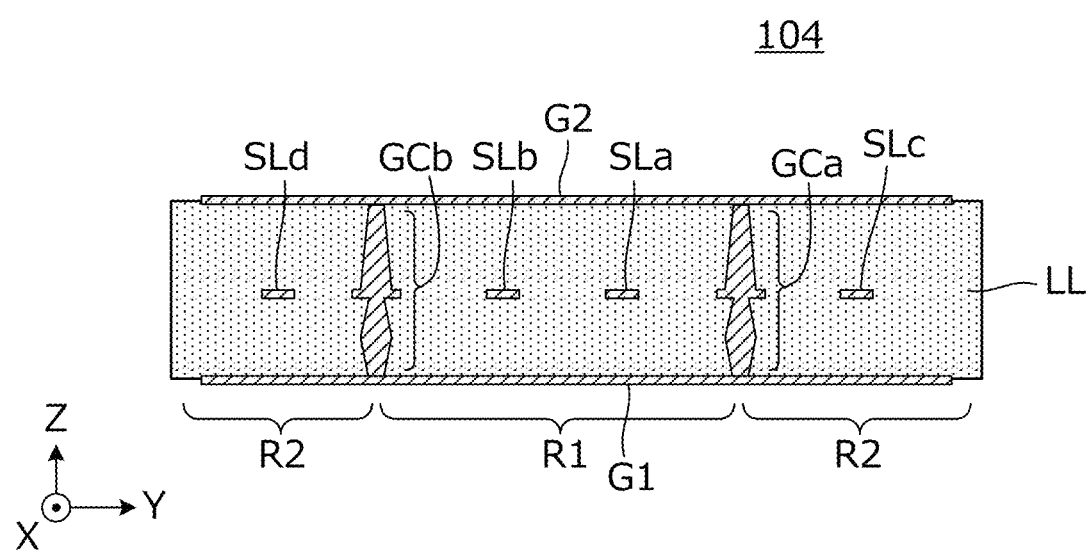
FIG. 6 is a cross-sectional view of a transmission line 104 according to a fourth preferred embodiment of the present invention.

FIG. 6 is a cross-sectional view of a transmission line 104 according to the fourth preferred embodiment. The configuration of each insulating substrate, the configuration of the parallel portion, and the like are the same as or similar to those of the transmission line 101 described in the first preferred embodiment.

As illustrated in FIG. 6, a plurality of insulating substrates are laminated to define the laminated body LL of insulating substrates. The first ground conductor G1 and the second ground conductor G2 face each other with the laminated body LL of the insulating substrate interposed therebetween. The signal lines SLa, SLb, SLc, and SLd are disposed between the first ground conductor G1 and the second ground conductor G2. The first ground conductor G1 and the second ground conductor G2 overlap the signal lines SLa, SLb, SLc, and SLd when viewed in the lamination direction (Z-axis direction). The first ground conductor G1 and the second ground conductor G2 are connected with ground connection conductors GCa and GCb interposed therebetween.

In FIG. 6, portions including the signal lines SLa, SLb, and SLc, the ground conductors G1 and G2, and the ground connection conductor GCa are the same or substantially the same as those of the transmission line 101 described in the first preferred embodiment. That is, the signal lines SLa, SLb, and SLc correspond to the signal lines SL1, SL2, and SL3 in the transmission line 101 described in the first preferred embodiment, respectively, and the ground connection conductor GCa corresponds to the ground connection conductor GC in the transmission line 101 described in the first preferred embodiment.

In addition, in FIG. 6, portions including the signal lines SLb, SLa, and SLd, the ground conductors G1 and G2, and the ground connection conductor GCb are the same or substantially the same as those of the transmission line 101 described in the first preferred embodiment. That is, the signal lines SLb, SLa, and SLd correspond to the signal lines SL1, SL2, and SL3 in the transmission line 101 described in the first preferred embodiment, respectively, and the ground connection conductor GCb corresponds to the ground connection conductor GC in the transmission line 101 described in the first preferred embodiment.

As illustrated in the present preferred embodiment, a plurality of transmission line portions including three signal lines and one ground connection conductor may be provided to define a transmission line.

Fifth Preferred Embodiment

In a fifth preferred embodiment of the present invention, a configuration example of an electronic device will be described.

Figure 7:
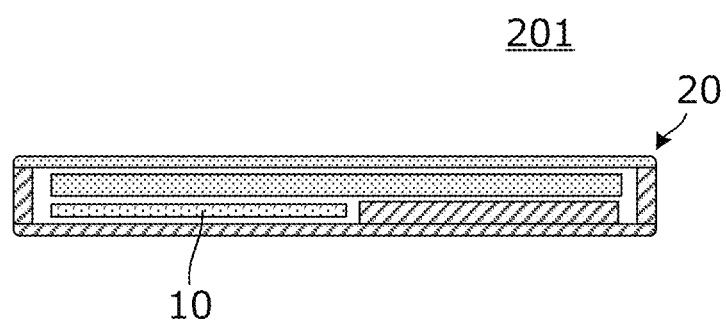
FIG. 7 is a cross-sectional view of an electronic device 201 according to a fifth preferred embodiment of the present invention.
Figure 8:
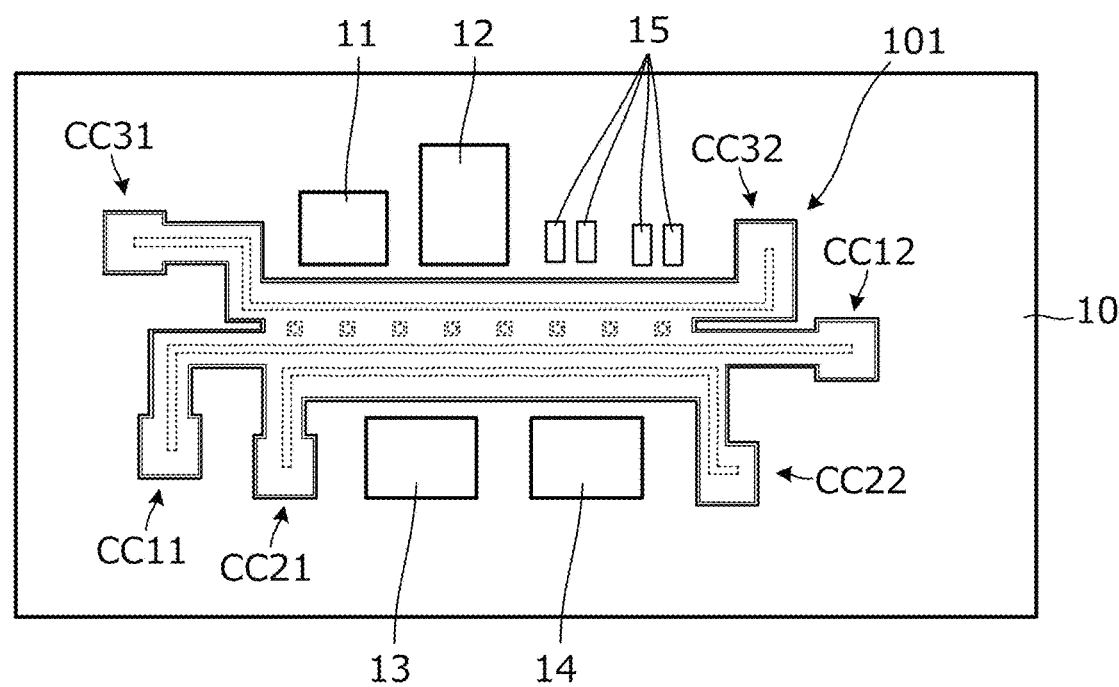
FIG. 8 is a plan view of a main portion of a circuit board 10 included in the electronic device 201 according to the fifth preferred embodiment of the present invention.
Figure 8:
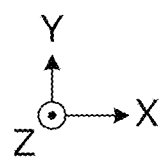

FIG. 7 is a cross-sectional view of an electronic device 201 according to the fifth preferred embodiment. The electronic device 201 includes a circuit board 10 on which a predetermined circuit is provided, and a housing 20 that houses the circuit board 10. FIG. 8 is a plan view of a main portion of the circuit board 10.

The transmission line 101 is mounted on the circuit board 10. The transmission line 101 is the transmission line 101 described in the first preferred embodiment. Mounting components 11, 12, 13, 14, and 15 are mounted on the circuit board 10. These mounting components are integrated circuits, high-frequency module components, chip capacitors, and the like, for example.

The circuit board 10 includes receptacles to which coaxial connectors (plugs) of the connection portions CC11, CC12, CC21, CC22, CC31, and CC32 provided on the lower surface of the transmission line 101 are connected. The transmission line 101 is mounted on the circuit board 10 by attaching the plugs of the connection portions CC11, CC12, CC21, CC22, CC31, and CC32 to the receptacles of the circuit board 10.

Figure 9:
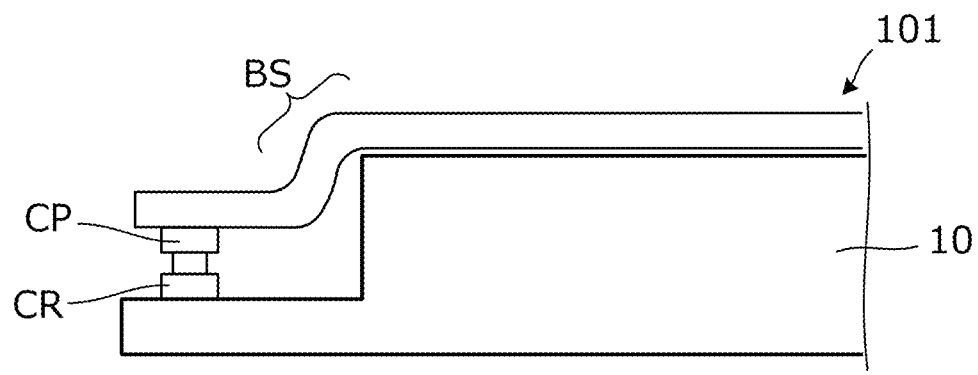
FIG. 9 is a front view of a main portion of another electronic device 202 according to the fifth preferred embodiment of the present invention.
Figure 9:
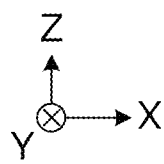

FIG. 9 is a front view of a main portion of another electronic device 202 according to the present preferred embodiment. The electronic device 202 includes the circuit board 10 including a step portion and the transmission line 101 mounted on the circuit board 10.

A receptacle CR is provided on the circuit board 10, and a plug CP of the transmission line 101 is connected thereto. The transmission line 101 includes a bent portion BS bent in the lamination direction of the insulating substrates. As described above, since the transmission line 101 includes the bent portion BS, the transmission line 101 can be mounted along the stepped portion of the circuit board 10.

According to preferred embodiments of the present invention, the size of the transmission line 101 in the thickness direction (Z-axis direction) is small (can be formed thin), so that bending in the thickness direction is facilitated, and a transmission line having a shape along the stepped portion can be easily provided.

Finally, the description of the above-described preferred embodiments is illustrative in all respects and is not restrictive. Modifications and changes can be made as appropriate by those skilled in the art. The scope of the present invention is defined not by the above-described preferred embodiments but by the claims. Furthermore, the scope of the present invention includes modifications from the preferred embodiments within the scope equivalent to the claims.

For example, in the transmission lines described in each preferred embodiment, the number of signal lines is not limited to the example described in the preferred embodiment, and another signal line may be added to achieve multi-core.

In each preferred embodiment, the example in which the plurality of striplines are defined by the plurality of signal lines and the first ground conductor G1 and the second ground conductor G2 sandwiching the signal lines is described, but another ground conductor and another signal line may be further provided in the lamination direction to achieve multi-core.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
   a conductor pattern; and
   a plurality of insulating substrates that are laminated in a lamination direction and on which the conductor pattern is provided; wherein
   the conductor pattern includes:
   a plurality of signal lines including a first signal line for a first signal, a second signal line for a second signal, and a third signal line for a third signal;
   a first ground conductor on a first side of the first signal line, the second signal line, and the third signal line in the lamination direction, and a second ground conductor on a second side opposite to the first side; and a ground connection conductor connecting the first ground conductor and the second ground conductor;

the first signal line, the second signal line, and the third signal line are parallel or substantially parallel with each other and define a parallel portion;

the ground connection conductor divides the parallel portion into a first region and a second region in a width direction of the plurality of signal lines in the parallel portion;

the first signal line and the second signal line are in the first region;

the third signal line is in the second region;

the parallel portion includes no ground conductor between the first signal line and the second signal line, between the first signal line and the third signal line, and between the second signal line and the third signal line in the lamination direction;

the parallel portion includes no conductor connecting the first ground conductor and the second ground conductor between the first signal line and the second signal line;

the first signal line is closer to the ground connection conductor than the second signal line in the parallel portion; and a closest frequency difference between a fundamental wave of one of the first signal and the second signal and a fundamental wave or a higher harmonic wave of another of the first signal and the second signal is equal to or larger than a closest frequency difference between a fundamental wave of one of the first signal and the third signal and a fundamental wave or a higher harmonic wave of another of the first signal and the third signal.

2. The transmission line according to claim 1, wherein the first signal line, the second signal line, and the third signal line are disposed in a same layer of the plurality of insulating substrates.

3. The transmission line according to claim 1, wherein the first ground conductor and the second ground conductor overlap the first signal line, the second signal line, and the third signal line when viewed in the lamination direction.

4. The transmission line according to claim 1, wherein a closest frequency difference between a fundamental wave of the one of the first signal and the second signal and a fundamental wave or a higher harmonic wave of the another of the first signal and the second signal is equal to or larger than a closest frequency difference between a fundamental wave of one of the second signal and the third signal and a fundamental wave or a higher harmonic wave of another of the second signal and the third signal.

5. The transmission line according to claim 1, wherein a closest frequency difference between a fundamental wave of the one of the third signal and the first signal and a fundamental wave or a higher harmonic wave of the another of the third signal and the first signal is equal to or larger than a closest frequency difference between a fundamental wave of one of the third signal and the second signal and a fundamental wave or a higher harmonic wave of another of the third signal and the second signal.

6. The transmission line according to claim 1, wherein the parallel portion includes a fourth signal line for a fourth signal parallel or substantially parallel with the third signal line in a same layer of the plurality of insulating substrates in the second region;

the parallel portion includes no conductor connecting the first ground conductor and the second ground conductor between the third signal line and the fourth signal line; and a closest frequency difference between a fundamental wave of one of the third signal and the fourth signal and a fundamental wave or a higher harmonic wave of another of the third signal and the fourth signal is equal to or larger than a closest frequency difference between a fundamental wave of one of the third signal and the first signal and a fundamental wave or a higher harmonic wave of another of the third signal and the first signal.

7. The transmission line according to claim 6, wherein a closest frequency difference between a fundamental wave of the one of the first signal and the third signal and a fundamental wave or a higher harmonic wave of the another of the first signal and the third signal is equal to or larger than a closest frequency difference between a fundamental wave of one of the first signal and the fourth signal and a fundamental wave or a higher harmonic wave of another of the first signal and the fourth signal.

8. The transmission line according to claim 1, wherein the parallel portion includes a fifth signal line parallel or substantially parallel with the second signal line in a same layer of the plurality of insulating substrates in the first region and disposed at a position opposite to the first signal line with respect to the second signal line;

the parallel portion includes no conductor connecting the first ground conductor and the second ground conductor between the second signal line and the fifth signal line; and a closest frequency difference between a fundamental wave of one of a fifth signal passing through the fifth signal line and the second signal and a fundamental wave or a higher harmonic wave of another of the fifth signal and the second signal is equal to or larger than a closest frequency difference between a fundamental wave of one of the fifth signal and the first signal and a fundamental wave or a higher harmonic wave of another of the fifth signal and the first signal.

9. The transmission line according to claim 8, wherein a closest frequency difference between a fundamental wave of the one of the second signal and the first signal and a fundamental wave or a higher harmonic wave of the another of the second signal and the first signal and a closest frequency difference between a fundamental wave of one of the second signal and the fifth signal and a fundamental wave or a higher harmonic wave of the other of the second signal and the fifth signal are larger than a closest frequency difference between a fundamental wave of one of the first signal and the fifth signal and a fundamental wave or a higher harmonic wave of another of the first signal and the fifth signal.

10. The transmission line according to claim 1, further comprising a bent portion bent in the lamination direction of the plurality of insulating substrates.

11. An electronic device comprising:

the transmission line according to claim 1;

a circuit board on which the transmission line is mounted; and a housing that houses the transmission line and the circuit board.

12. The electronic device according to claim 11, wherein the first signal line, the second signal line, and the third signal line are disposed in a same layer of the plurality of insulating substrates.

13. The electronic device according to claim 11, wherein the first ground conductor and the second ground conductor overlap the first signal line, the second signal line, and the third signal line when viewed in the lamination direction.

14. The electronic device according to claim 11, wherein a closest frequency difference between a fundamental wave of the one of the first signal and the second signal and a fundamental wave or a higher harmonic wave of the another of the first signal and the second signal is equal to or larger than a closest frequency difference between a fundamental wave of one of the second signal and the third signal and a fundamental wave or a higher harmonic wave of another of the second signal and the third signal.

15. The electronic device according to claim 11, wherein a closest frequency difference between a fundamental wave of the one of the third signal and the first signal and a fundamental wave or a higher harmonic wave of the another of the third signal and the first signal is equal to or larger than a closest frequency difference between a fundamental wave of one of the third signal and the second signal and a fundamental wave or a higher harmonic wave of another of the third signal and the second signal.

16. The electronic device according to claim 11, wherein
the parallel portion includes a fourth signal line for a fourth signal parallel or substantially parallel with the third signal line in a same layer of the plurality of insulating substrates in the second region;
the parallel portion includes no conductor connecting the first ground conductor and the second ground conductor between the third signal line and the fourth signal line; and
a closest frequency difference between a fundamental wave of one of the third signal and the fourth signal and a fundamental wave or a higher harmonic wave of another of the third signal and the fourth signal is equal to or larger than a closest frequency difference between a fundamental wave of one of the third signal and the first signal and a fundamental wave or a higher harmonic wave of another of the third signal and the first signal.

17. The electronic device according to claim 16, wherein a closest frequency difference between a fundamental wave of the one of the first signal and the third signal and a fundamental wave or a higher harmonic wave of the another of the first signal and the third signal is equal to or larger than a closest frequency difference between a fundamental wave of one of the first signal and the fourth signal and a fundamental wave or a higher harmonic wave of another of the first signal and the fourth signal.

18. The electronic device according to claim 11, wherein
the parallel portion includes a fifth signal line parallel or substantially parallel with the second signal line in a same layer of the plurality of insulating substrates in the first region and disposed at a position opposite to the first signal line with respect to the second signal line;
the parallel portion includes no conductor connecting the first ground conductor and the second ground conductor between the second signal line and the fifth signal line; and
a closest frequency difference between a fundamental wave of one of a fifth signal passing through the fifth signal line and the second signal and a fundamental wave or a higher harmonic wave of another of the fifth signal and the second signal is equal to or larger than a closest frequency difference between a fundamental wave of one of the fifth signal and the first signal and a fundamental wave or a higher harmonic wave of another of the fifth signal and the first signal.

19. The electronic device according to claim 18, wherein a closest frequency difference between a fundamental wave of the one of the second signal and the first signal and a fundamental wave or a higher harmonic wave of the another of the second signal and the first signal and a closest frequency difference between a fundamental wave of one of the second signal and the fifth signal and a fundamental wave or a higher harmonic wave of the other of the second signal and the fifth signal are larger than a closest frequency difference between a fundamental wave of one of the first signal and the fifth signal and a fundamental wave or a higher harmonic wave of another of the first signal and the fifth signal.

20. The electronic device according to claim 11, further comprising a bent portion bent in the lamination direction of the plurality of insulating substrates.

* * * * *